United States Patent
Kim et al.

(10) Patent No.: US 11,388,277 B2
(45) Date of Patent: Jul. 12, 2022

(54) ELECTRONIC DEVICE INCLUDING INTERPOSER

(71) Applicant: Samsung Electronics Co., Ltd., Gyeonggi-do (KR)

(72) Inventors: Taewoo Kim, Gyeonggi-do (KR); Dui Kang, Gyeonggi-do (KR); Bongkyu Min, Gyeonggi-do (KR); Bongchoon Park, Gyeonggi-do (KR); Sanghoon Park, Gyeonggi-do (KR); Jinyong Park, Gyeonggi-do (KR); Hyelim Yun, Gyeonggi-do (KR); Hyeongju Lee, Gyeonggi-do (KR); Younoh Chi, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/985,516

(22) Filed: Aug. 5, 2020

(65) Prior Publication Data

US 2021/0099560 A1 Apr. 1, 2021

(30) Foreign Application Priority Data

Sep. 27, 2019 (KR) .................. 10-2019-0119773

(51) Int. Cl.
   *H05K 1/02* (2006.01)
   *H04M 1/02* (2006.01)
   *H05K 1/18* (2006.01)
   *H05K 1/11* (2006.01)

(52) U.S. Cl.
   CPC ....... *H04M 1/0277* (2013.01); *H04M 1/0274* (2013.01); *H05K 1/115* (2013.01); *H05K 1/181* (2013.01)

(58) Field of Classification Search
   CPC ......... H05K 2201/10378; H05K 1/144; H05K 1/116; H05K 1/0222
   USPC .......................................... 174/255
   See application file for complete search history.

(56) References Cited

U.S. PATENT DOCUMENTS

| | | | |
|---|---|---|---|
| 7,808,072 B2 | 10/2010 | Choi et al. | |
| 7,845,954 B2 * | 12/2010 | Tomura | H05K 3/403 439/66 |
| 2002/0076919 A1 * | 6/2002 | Peters | H01L 23/50 438/637 |

(Continued)

FOREIGN PATENT DOCUMENTS

| | | |
|---|---|---|
| JP | 2006-019455 | 1/2006 |
| JP | 6293038 | 3/2018 |

(Continued)

OTHER PUBLICATIONS

International Search Report dated Oct. 12, 2020 issued in counterpart application No. PCT/KR2020/009024, 7 pages.

*Primary Examiner* — Sherman Ng
(74) *Attorney, Agent, or Firm* — The Farrell Law Firm, P.C.

(57) ABSTRACT

An interposer and an electronic device including an interposer are provided. The interposer includes a multi-conductive member. The multi-conductive member includes an insulation member, a first conductive member that is disposed inside the insulation member and electrically transmits a designated signal or a designated power; and a ground member that surrounds the insulation member.

20 Claims, 15 Drawing Sheets

(56) References Cited

U.S. PATENT DOCUMENTS

| | | | |
|---|---|---|---|
| 2005/0184381 A1* | 8/2005 | Asahi | H05K 1/141 |
| | | | 257/693 |
| 2006/0001174 A1 | 1/2006 | Matsui | |
| 2009/0102500 A1* | 4/2009 | An | H01R 12/714 |
| | | | 324/755.02 |
| 2011/0073355 A1* | 3/2011 | Tamura | H01L 24/72 |
| | | | 174/255 |
| 2019/0082534 A1 | 3/2019 | Hoang et al. | |
| 2019/0082536 A1* | 3/2019 | Park | G06F 1/1635 |
| 2019/0159333 A1 | 5/2019 | Sinha et al. | |
| 2019/0319381 A1 | 10/2019 | Bang et al. | |
| 2020/0329562 A1* | 10/2020 | Hsieh | H05K 1/112 |

FOREIGN PATENT DOCUMENTS

| | | |
|---|---|---|
| KR | 10-0898503 | 5/2009 |
| WO | WO 2019/099989 | 5/2019 |
| WO | WO 2019-199115 | 10/2019 |

\* cited by examiner

ELECTRONIC DEVICE INCLUDING INTERPOSER

CROSS-REFERENCE TO RELATED APPLICATION(S)

This application is based on and claims priority under 35 U.S.C. § 119 to Korean Patent Application No. 10-2019-0119773, filed on Sep. 27, 2019, in the Korean Intellectual Property Office, the entire disclosure of which is incorporated herein by reference.

BACKGROUND

1. Field

The disclosure relates generally to an electronic device including an interposer.

2. Description of Related Art

To satisfy consumer needs, electronic devices are gradually becoming slimmer, and are being improved to increase the rigidity of the slimmer electronic devices, to achieve improvement in design. Particularly, it is important that electronic devices have a sturdy structure that maintains electrical connections between electronic components installed therein even against an external impact.

For example, an electronic device may include electronic components disposed in an inner space thereof, wherein the electronic components are electrically connected to each other in order to perform corresponding functions of the electronic device. Such electronic components may include printed circuit boards (PCBs) disposed in the inner space of the electronic device. Each of the PCBs may be laminated on each other in order to secure an efficient mounting space and may be electrically connected to each other by an interposer interposed therebetween. Each of the PCBs may include a plurality of conductive terminals and may be electrically connected to each other by being in physical contact with the plurality of corresponding conductive terminals disposed on a corresponding surface of the interposer.

However, due to the increasing slimness of an electronic device, an arrangement gap between electronic components is decreasing in order to reduce the size of a terminal itself or the gap between surfaces of the terminal. As a result, a design margin may be insufficient, or a signal transmitted through the terminal may be affected from the vicinity thereof due to interference.

SUMMARY

The disclosure is made to address at least the disadvantages described above and to provide at least the advantages described below.

Accordingly, an aspect of the disclosure is to provide an electronic device including an interposer, which can secure a design margin through an appropriate design change of a ground disposed around a terminal and reduce an interference in which a signal transmitted through a terminal is affected from the vicinity thereof.

In accordance with an aspect of the disclosure, an electronic device is provided, which inclues a first printed circuit board (PCB) including a first conductive terminal; a second PCB including a second conductive terminal; and an interposer including a multi-conductive member that electrically connects the first conductive terminal of the first PCB and the second conductive terminal of the second PCB. The multi-conductive member includes an insulation member; a first conductive member that is disposed inside the insulation member and electrically transmits a designated signal or a designated power; and a ground member that surrounds the insulation member.

In accordance with an aspect of the disclosure, an interposer is provided for electrically connecting a first conductive terminal of a first printed circuit board and a second conductive terminal of a second printed circuit board. The interposer includes a multi-conductive member. The multi-conductive member includes an insulation member, a first conductive member that is disposed inside the insulation member and electrically transmits a designated signal or a designated power, and a ground member that surrounds the insulation member.

BRIEF DESCRIPTION OF THE DRAWINGS

The above and other aspects, features and advantages of certain embodiments of the disclosure will be more apparent from the following description taken in conjunction with the accompanying drawings, in which.

DETAILED DESCRIPTION

Figure 1:
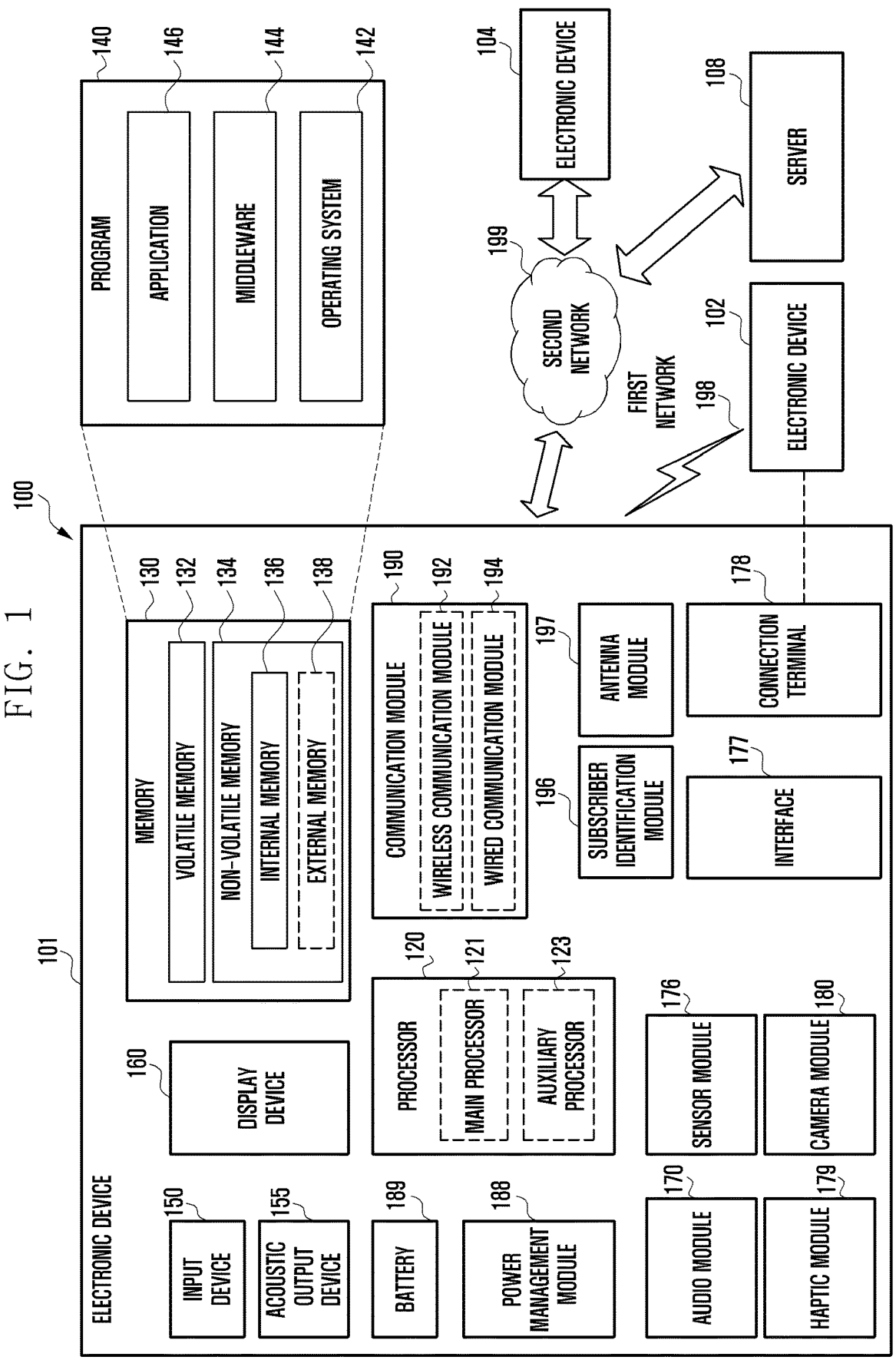
FIG. 1 is a block diagram of an electronic device within a network environment according to an embodiment.

FIG. 1 is a block diagram illustrating an electronic device 101 in a network environment 100 according to an embodiment.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, ISPs, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the AP) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2A:
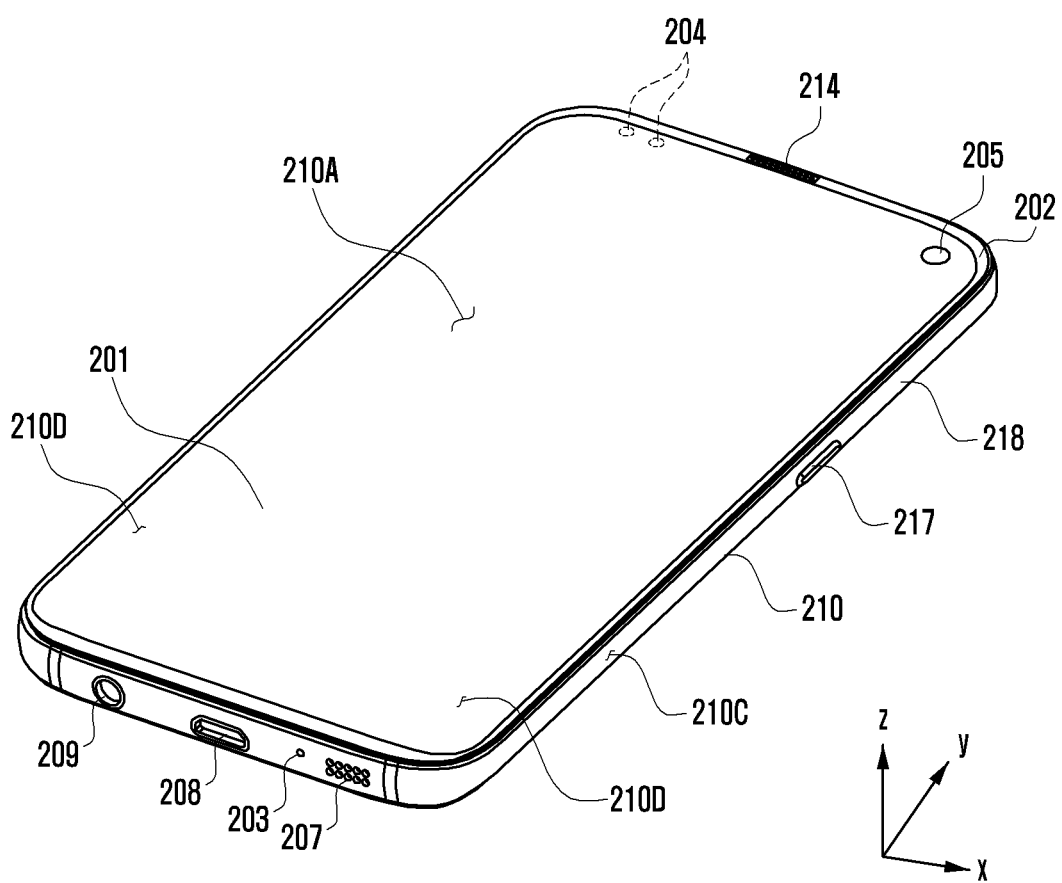
FIG. 2A illustrates a front perspective view of a mobile electronic device according to an embodiment.
Figure 2B:
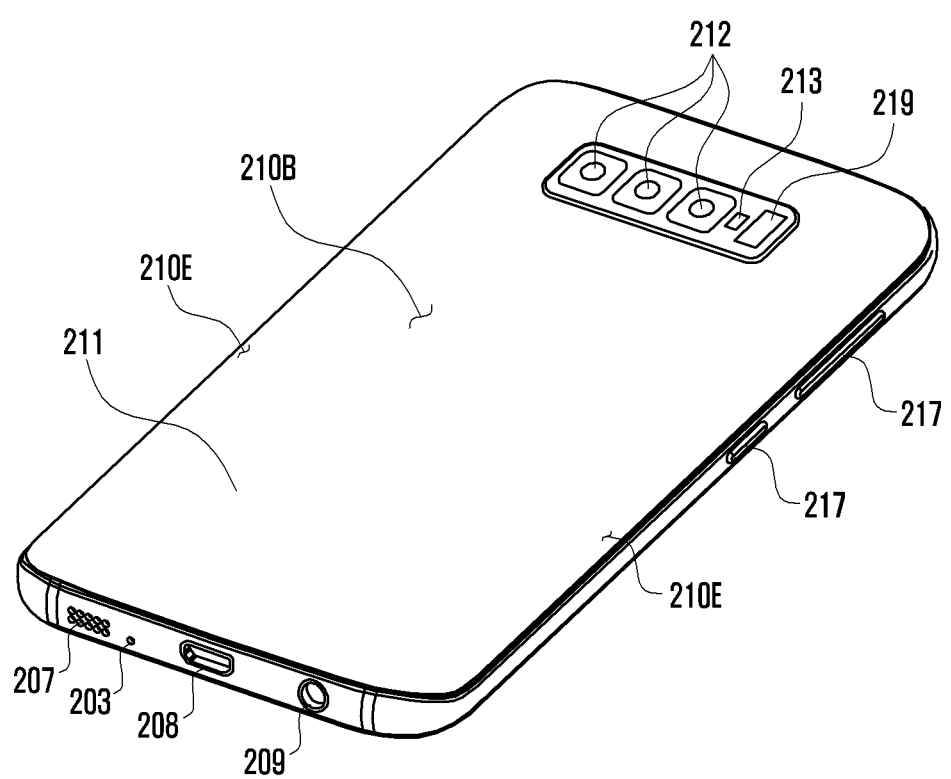
FIG. 2B illustrates a rear perspective view of the electronic device of FIG. 2A.

FIG. 2A illustrates a front perspective view of a mobile electronic device according to an embodiment, and FIG. 2B illustrates a rear perspective view of the electronic device of FIG. 2A.

Referring to FIGS. 2A and 2B, an electronic device includes a housing 210, which includes a first surface (or front surface) 210A, a second surface (or rear surface) 210B, and a side surface 210C surrounding a space between the first surface 210A and the second surface 210B. Alternatively, a housing may be a structure that forms a part among the first surface 210A, the second surface 210B, and the side surface 210C of FIG. 2A. The first surface 210A may have at least a part formed by a substantially transparent front surface plate 202 (e.g., a glass plate including various coating layers or a polymer plate). The second surface 210B may be formed by a substantially opaque rear surface plate 211. The rear surface plate 211 may be formed by a glass coated or colored with a ceramic, a polymer, and/or metal (e.g., aluminum, stainless steel (STS), or magnesium). The side surface 210C may be formed by a side surface bezel structure 218 (or side surface member) that is coupled to the front surface plate 202 and the rear surface plate 211 and includes a metal and/or a polymer. The rear surface plate 211 and the side surface bezel structure 218 may be integrally formed with each other and include an identical material (e.g., a metal material such as aluminum).

The front surface plate 202 includes a first area 210D, which is bent from the first surface 210A toward the rear surface plate and seamlessly extends, and the first area 210D may be provided at both ends of long edge of the front surface plate. The rear surface plate 211 includes a second area 210E, which is bent from the second surface 210B toward the front surface plate and seamlessly extends, and the second area 210E may be provided at both ends of long edge of the rear surface plate. The front surface plate 202 or the rear surface plate 211 may include one of the first areas 210D or one of the second areas 210E, respectively. The front surface plate 202 may not include the first area and the second area and may include only a flat surface disposed parallel to the second surface 210B. When the electronic device is viewed from the side surface thereof, the side surface bezel structure 218 may include a side surface not including the first area 210D or the second area 210E, which has a first thickness (width), and may include a side surface including the first area or the second area which has a second thickness thinner than the first thickness.

The electronic device includes a display 201, an input device 203, sound output devices 207 and 214, sensor modules 204 and 219, camera modules 205, 212, and 213, a key input device 217, an indicator, and connectors 208 and 209. Alternatively, the electronic device may omit at least one of the illustrated elements or may include an addition element.

A display 201 may be exposed through a substantial part of the front surface plate 202. For example, at least a part of the display 201 may be exposed through the first surface 210A and the front surface plate 202 forming the first area 210D of the side surface 210C. The display 201 may be coupled to or disposed adjacent to a touch detection circuit, a pressure sensor capable of measuring intensity of touch (pressure), and/or a digitizer detecting a magnetic-field type stylus pen. At least a part of the sensor modules 204 and 219 and/or at least a part of the key input device 217 may be disposed at the first area 210D and/or the second area 210E.

The input device 203 may include a microphone 203. The input device 203 may include a plurality of microphones 203 that detect directions of sound.

The sound output devices 207 and 214 may include speakers 207 and 214. The speakers 207 and 214 may include an external speaker 207 and a call receiver 214.

The microphone 203, the speakers 207 and 214, and the connectors 208 and 209 may be disposed in the space of the electronic device and exposed to the external environment through at least one hole formed through the housing 210. The hole formed through the housing 210 may be commonly used for the microphone 203 and the speakers 207 and 214. The sound output device 207 or 214 may include a speaker (e.g., a piezo-speaker) that operates without using the hole formed through the housing 210.

The sensor modules 204 and 219 may generate an electric signal or a data value corresponding to the operation state of the inside the electronic device or to the external environmental state. The sensor modules 204 and 219 may include a first sensor module 204 (e.g., a proximity sensor) and/or a second sensor module (e.g., a fingerprint sensor) disposed on the first surface 210A of the housing 210, and/or a third sensor module 219 (e.g., a heart rate module (HRM) sensor) disposed on the second surface 210B of the housing 210. The fingerprint sensor may be disposed on the first surface 210A (e.g., a home key button 215) of the housing 210, at a portion area of the second surface 210B, or below the display 201. The electronic device may further include a gesture sensor, a gyro sensor, an air pressure sensor, a magnetic sensor, an acceleration sensor, a grip sensor, a color sensor, an IR sensor, a biometric sensor, a temperature sensor, a humidity sensor, and/or an illuminance sensor.

The camera modules 205, 212, and 213 may include a first camera device 205 disposed on the first surface 210A of the electronic device, a second camera device 212 disposed on the second surface 210B, and/or a flash 213. The camera modules 205 and 212 may include one lens or a plurality of lenses, an image sensor, and/or an ISP. The flash 213 may include a light-emitting diode (LED) or a xenon lamp. Two or more lenses (e.g., a wide-angle lens, a super wide-angle lens, or a telephoto lens) and image sensors may be disposed on one surface of the electronic device.

The key input device 217 may be disposed on the side surface 210C of the housing 210. The electronic device may also omit some or an entirety of the key input device 217 mentioned above, and the key input device 217, which is not included in the electronic device, may be implemented as another type such as a soft key on the display 201. The key input device 217 may be implemented using a pressure sensor embedded in the display 201.

The indicator may be disposed on the first surface 210A of the housing 210. The indicator may provide, state information of the electronic device in the form of light. The light-emitting element may provide a light source linked to operations of the camera module 205. The indicator may include an LED, an IR LED, and/or a xenon lamp.

The connector holes 208 and 209 may include a first connector hole 208 capable of accommodating a connector (e.g., a USB connector) for transmitting and receiving electric power and/or data to and from an external electronic device, and a second connector hole 209 (or earphone jack) capable of accommodating a connector for transmitting and receiving an audio signal to and from an external electronic device.

The camera module 205, the sensor module 204, or the indicator may be disposed to be exposed through the display 201 in order to be able to contact the external environment through a through-hole perforated up to the front surface plate 202 of the display 201, in the inner space of the electronic device. Alternatively, a sensor module 240 in the inner space of the electronic device may perform a function while not being visually exposed through the front surface plate 202. For example, in this case, an area facing the sensor module of the display 201 may not require a perforation hole.

Figure 3:
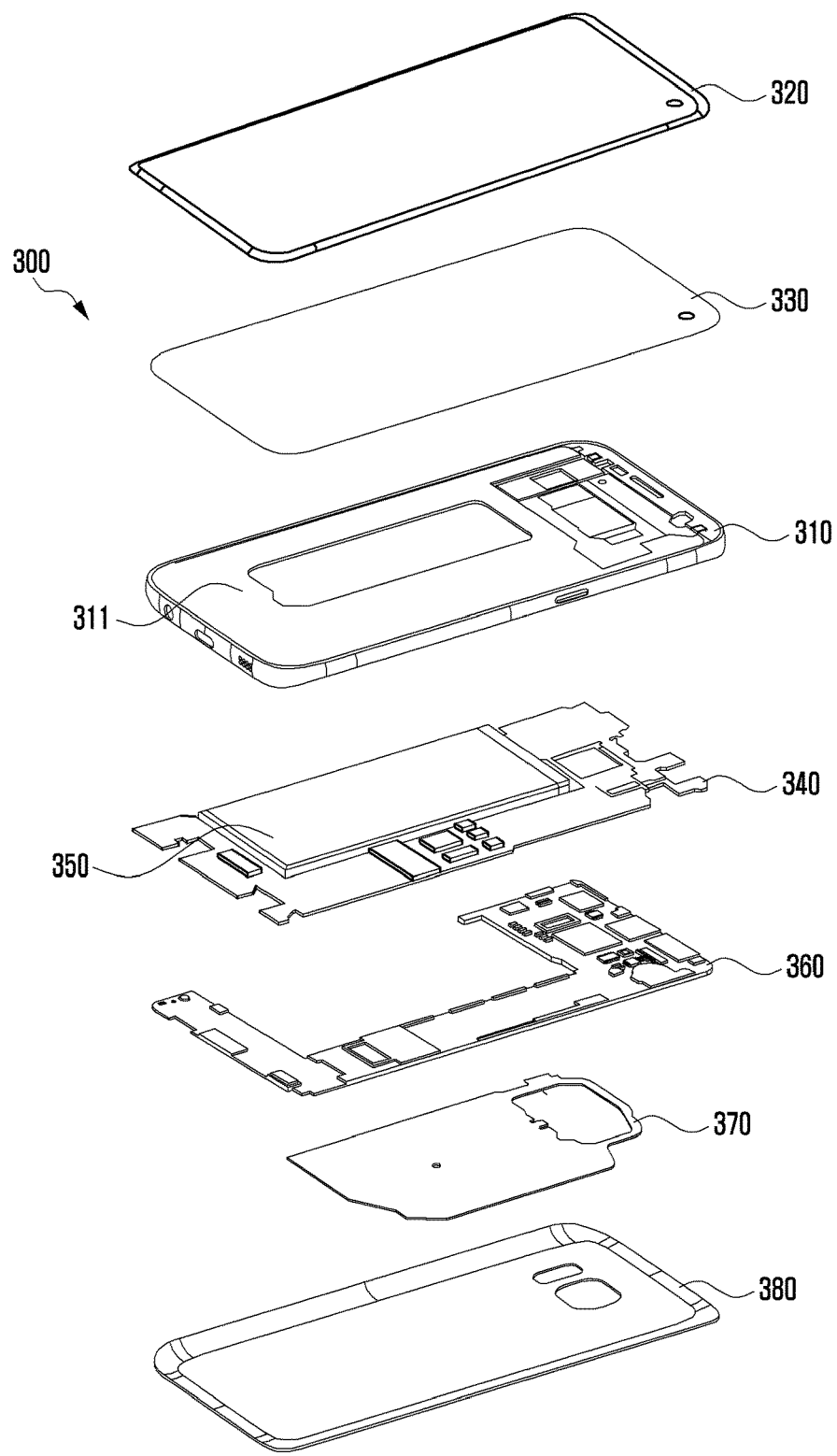
FIG. 3 illustrates an exploded perspective view of an electronic device of according to an embodiment.

FIG. 3 illustrates an exploded perspective view of an electronic device according to an embodiment.

Referring to FIG. 3, an electronic device 300 includes a side surface member 310 (e.g., a side surface bezel structure), a first support member 311 (e.g., a bracket or a support structure), a front surface plate 320 (e.g., a front surface cover), a display 330, a PCB 340, a battery 350, a second support member 360 (e.g., a rear case), an antenna 370, and a rear surface plate 380 (e.g., a rear surface cover). Alternatively, the electronic device 300 may omit at least one of the illustrated elements (e.g., the first support member 311 or the second support member 360) or may include addition elements.

The first support member 311 may be disposed inside the electronic device 300 to be connected to the side surface member 310 or may be integrally formed with the side surface member 310. The first support member 311 may be made of a metal material and/or a non-metal material (e.g., a polymer). The first support member 311 may have one surface to which the display 300 is coupled and the other surface to which the PCB 340 is coupled. A processor, a memory, and/or an interface may be mounted on the PCB 340. The processor may include one or more among a CPU, an AP, a GPU, an ISP, a sensor hub processor, or a CP.

The memory may include a volatile memory or a non-volatile memory.

The interface may include an HDMI, a USB interface, an SD card interface, and/or an audio interface. The interface may electrically or physically connect the electronic device 300 to an external electronic device and may include a USB connector, an SD card/multimedia card (MMC) connector, or an audio connector.

The battery 350 serves supplies electric power to at least one constituent element of the electronic device 300 and may include a non-rechargeable primary cell, a rechargeable secondary cell, or a fuel cell. At least a portion of the battery 350 may be disposed on a plane surface substantially identical to the PCB 340. The battery 350 may be integrally disposed inside the electronic device 300 or may detachably attach to electronic device 300.

The antenna 370 may be disposed between the rear surface plate 380 and the battery 350. The antenna 370 may include a near field communication (NFC) antenna, a wireless charging antenna, and/or a magnetic secure transmission (MST) antenna. The antenna 370 may communicate with the external device in an NFC manner or may transmit and receive electric power necessary for charging in a wireless manner. An antenna structure is formed by the side surface bezel structure 310, and/or a portion of the first support member 311 or a combination thereof.

Figure 4:
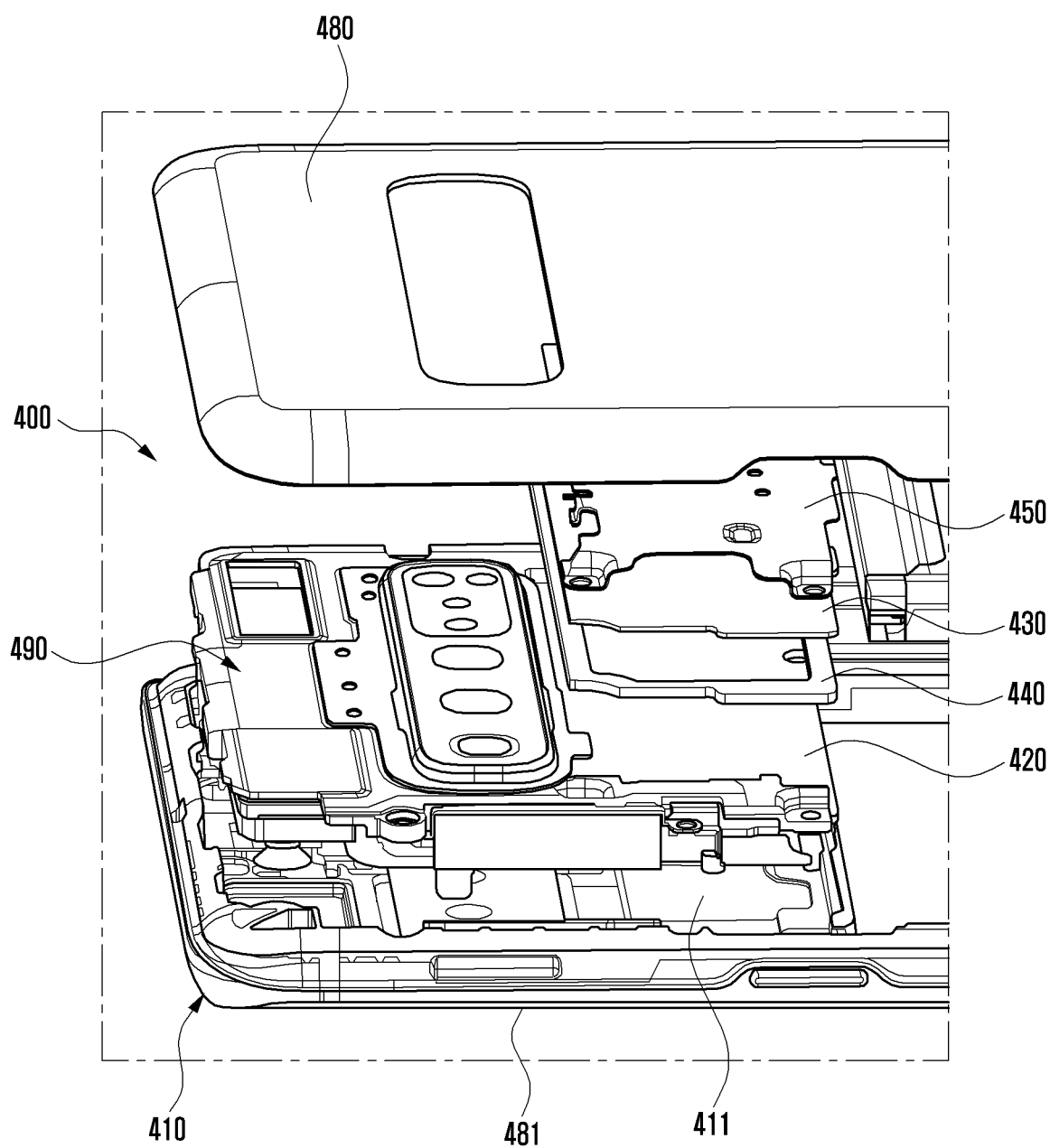
FIG. 4 illustrates an electronic device including an interposer according to an embodiment.

FIG. 4 illustrates an electronic device including an interposer according to an embodiment.

Referring to FIG. 4, an electronic device 400 includes a housing structure including a front surface cover 481, a rear surface cover 480 facing in a direction opposite to the front surface cover 481, and side surface member 410 surrounding a space between the front surface cover 481 and the rear surface cover 480. The electronic device 400 includes a first support member 411 disposed in the inner space. The first support member 411 may extend from the side surface member 410 to the inner space. The first support member 411 may also be separately provided in the inner space of the electronic device 440. The first support member 411 may extend from the side surface member 410 and may have at least a partial area made of a conductive material. The electronic device 400 includes a camera structure 490 disposed in a space between the front surface cover 481 and the rear surface cover 480.

The electronic device 400 includes a pair of PCBs 420 and 430 disposed between the first support member 411 and the rear surface cover 480 in the inner space. When the front surface cover 481 is viewed from the top, at least a partial area of the pair of PCBs 420 and 430 may be disposed to be overlapped with each other. The pair of PCBs 420 and 430 may include the first PCB 420 (e.g.: main board) which is disposed between the first support member 411 and the rear surface cover 480 and the second PCB 430 (e.g., sub board) which is disposed between the first PCB 420 and the rear surface cover 480.

The electronic device 400 includes the interposer 440, which is interposed between the first PCB 420 and the second PCB 430. The interposer 440 may include a plurality of conductive terminals and may be in physical contact with the conductive terminals disposed between the two PCBs 420 and 430 through a pre-solder, in order to electrically connect the two PCBs 420 and 430 to each other. The electronic device 400 includes the second support member 450 disposed between the second PCB 430 and the rear surface cover 480. The second support member 450 may be disposed at a position at least partially overlapped with the second circuit printed board 430. The second support member 450 may include a metal plate. Therefore, the first PCB 420, the interposer 440, and the second PCB 430 may be fixed to the first support member 411 by the second support member 450 disposed above. For example, the second support member 450 may be fastened to the first support member 411 by a fastening member such as a screw, in order to firmly support an electrical connection between the first PCB 420, the interposer 440, and the second PCB 430.

Figure 5:
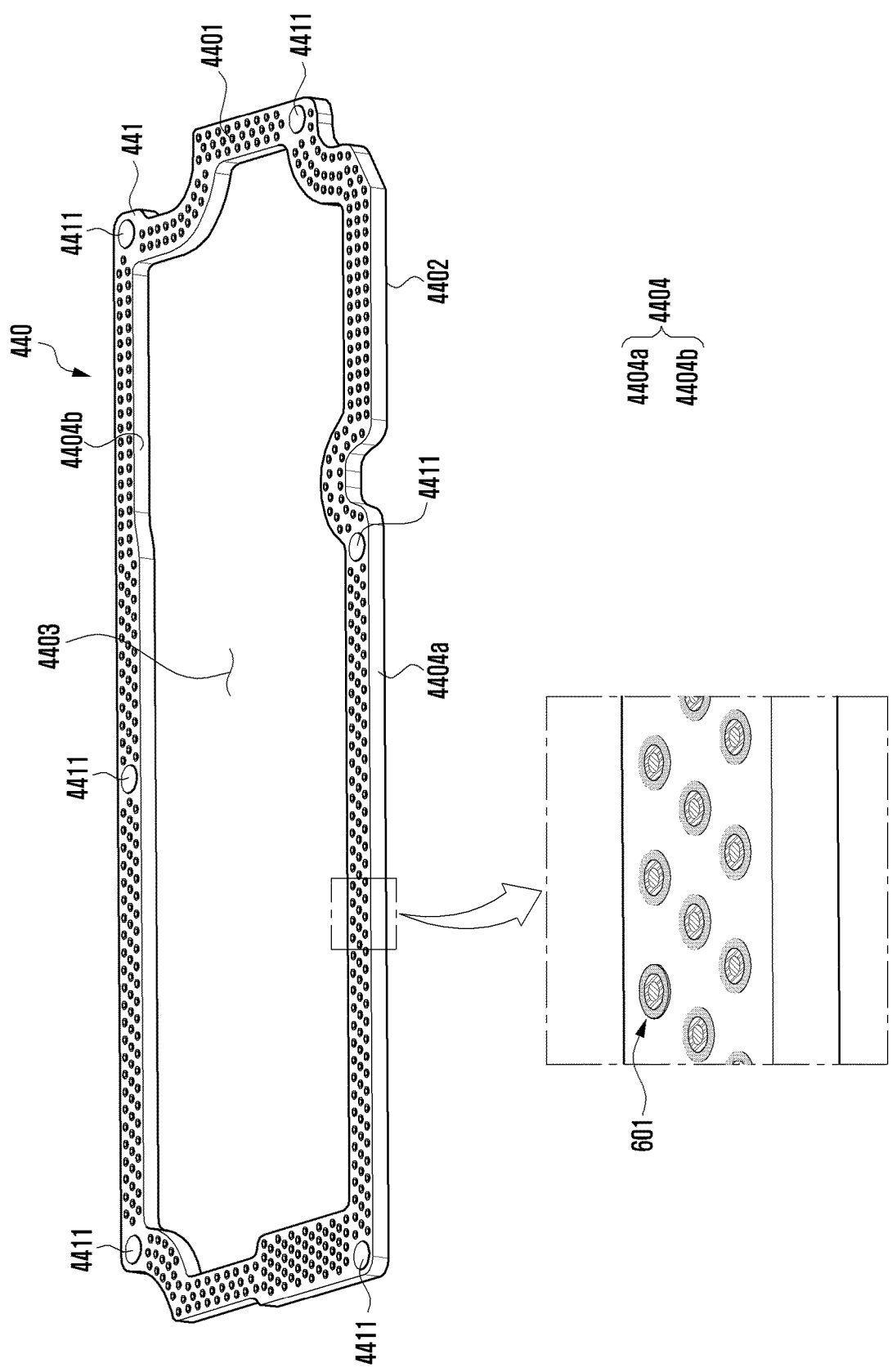
FIG. 5 illustrates a perspective view of an interposer according to an embodiment.

FIG. 5 illustrates an interposer according to an embodiment.

Referring to FIG. 5, an interposer 440 includes a dielectric substrate 441, which includes a first surface 4401 and a second surface 4402 facing in a direction opposite to the first surface 4401. The interposer 440 includes a multi-conductive member 601, which has a constant interval or a non-constant interval with respect to the first surface 4401 and the second surface 4402 and has at least a part that is exposed to the outside. The multi-conductive member 601 may be formed on the interposer 440 to transmit an electrical signal and may include a conductive via for transmitting an electrical signal and a ground via. The multi-conductive member 601 may transmit electrical signals (or power) provided from a component facing the first surface 4401 of the interposer 440 to a component facing the second surface 4402 of the interposer 440, or the multi-conductive member 601 may transmit electrical signals provided from a component facing the second surface 4402 of the interposer 440 to a component facing the first surface 4401 of the interposer 440.

A multi-conductive member may also be referred to as a dual-conductive member.

A plurality of conductive members may be formed on the interposer 440 and some or all of the plurality of conductive members may be formed as the multi-conductive member 601. For example, in the interposer 440, some of the plurality of conductive members may be formed as the multi-conductive member 601 including a conductive via and a ground via and other conductive members thereof may be formed as a conductive member including a single conductive via. The interposer 440 may include the plurality of conductive members and all of the plurality of conductive members may be formed as the multi-conductive member 601 including the conductive via and the ground via.

The interposer 440 may include at least one screw fastening part 4411 which is at least partially disposed. The interposer 440 may be fixed to at least one support structure, which is disposed inside an electronic device by the screw fastening part 4411. The interposer 440 may be fixed thereto by various other fixation types besides a screw. The interposer 440 may be bonded (fixed) by a soldering, and the portion corresponding to screw fastening part 4411 in FIG. 5 may instead be a solder pad for improving a coupling force when being bonded by a solder.

The interposer 440 may be substantially the same shape as at least one PCB of the first PCB and the second PCB and may include an opening 4403 formed through the center thereof. The opening 4403 may be used as a reception space for receiving electronic components that are disposed on at least one of the two PCBs 420 and 430.

The interposer 440 includes a side surface 4404 surrounding a space (e.g., opening 4403) between the first surface 4401 and the second surface 4402. The side surface 4404 of the interposer 440 may be divided into and defined as an outer side surface 4404a and an inner sided surface 4404b. At least a portion of the outer side surface 4404a or at least a portion of the inner side surface 4404b may be plated to serve as a noise shielding.

Figure 6:
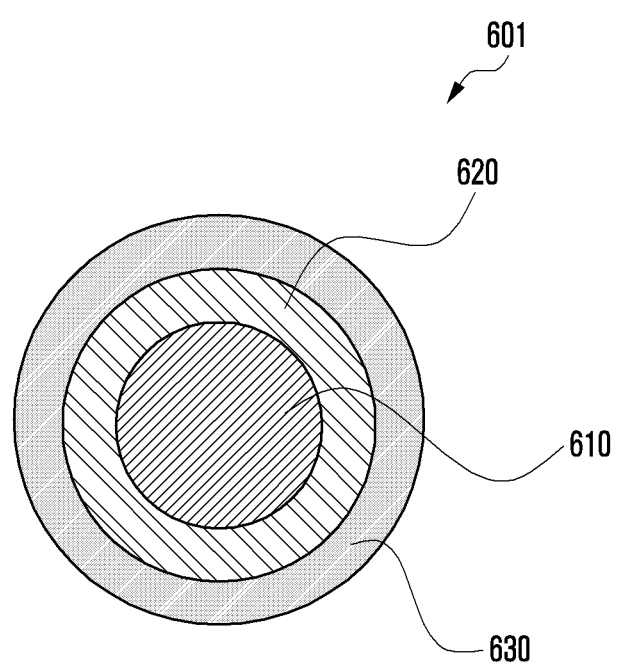
FIG. 6 illustrates a plan view illustrating a multi-conductive member formed on an interposer according to an embodiment.

FIG. 6 illustrates a multi-conductive member formed on an interposer according to an embodiment.

Referring to FIG. 6, the multi-conductive member 601 includes a first conductive member 610, an insulation member 620, or a second conductive member 630.

The first conductive member 610 may electrically transmit a designated signal or a designated power. The first conductive member 610 may transmit electrical signals (or power) provided from a component facing the first surface of the interposer to a facing the second surface 4402 of interposer 440.

The insulation member 620 may surround the first conductive member 610. In The insulation member 620, inside the interposer 440, may surround the entire side surface of the first conductive member 610.

The second conductive member 630 may surround the insulation member 620 and may be connected to a ground. The second conductive member 630, inside the interposer, may surround the entire side surface of the insulation member 620 surrounding the side surface of the first conductive member 610. The second conductive member 630 may be connected to the ground in order to block the first conductive member 610.

The roles of the first conductive member 610 and the second conductive member 630 may be changed. For example, the first conductive member 610 may be connected to a ground and the second conductive member 630 may electrically transmit a designated signal and a designated power.

An electronic device according to an embodiment of the disclosure may include a housing, a first PCB disposed in an inner space of the housing and includes at least one conductive terminal, a second PCB disposed to face the first PCB in the inner space and includes at least one conductive terminal, and an interposer including a multi-conductive member that electrically connects the conductive terminal of the first PCB and the conductive terminal of the second PCB between the first PCB and the second PCB. The multi-conductive member may include an insulation member, a first conductive member which is disposed inside the insulation member and is configured to electrically transmit a designated signal or a designated power, and a ground member which surrounds the insulation member and is connected to a ground. The insulation member, inside the interposer, may be formed to surround the entire side surface of the first conductive member. The ground member, inside the interposer, may be formed to surround the entire side surface of the insulation member. The first conductive member may include an upper conductive pad being exposed through a first surface, which faces the first PCB, of the interposer, a lower conductive pad being exposed through a second surface, which faces the second PCB, of the interposer, and a conductive via which is formed to pass through an inside of the interposer and electrically connects the upper conductive pad and the lower conductive pad. The insulation member, inside the interposer, may include a non-conductive filler which partitions between the conductive via and the ground member. The multi-conductive member may further include a second conductive member, and transmit a first signal through the first conductive member and a second signal through the second conductive member. The first signal and the second signal may be two paired signals or one pair of differential signals. The ground member may include a middle ground member which is formed between the first conductive member and the second conductive member. The first conductive member may have the same structure as the second conductive member. The second conductive member may include a second upper conductive pad being exposed through a first surface, which faces the first PCB of the interposer, a second lower conductive pad being exposed through a second surface, which faces the second PCB of the interposer, and a second conductive via which is formed to pass through an inside of the interposer and is configured to electrically connect the second upper conductive pad and the second lower conductive pad.

Figure 7:
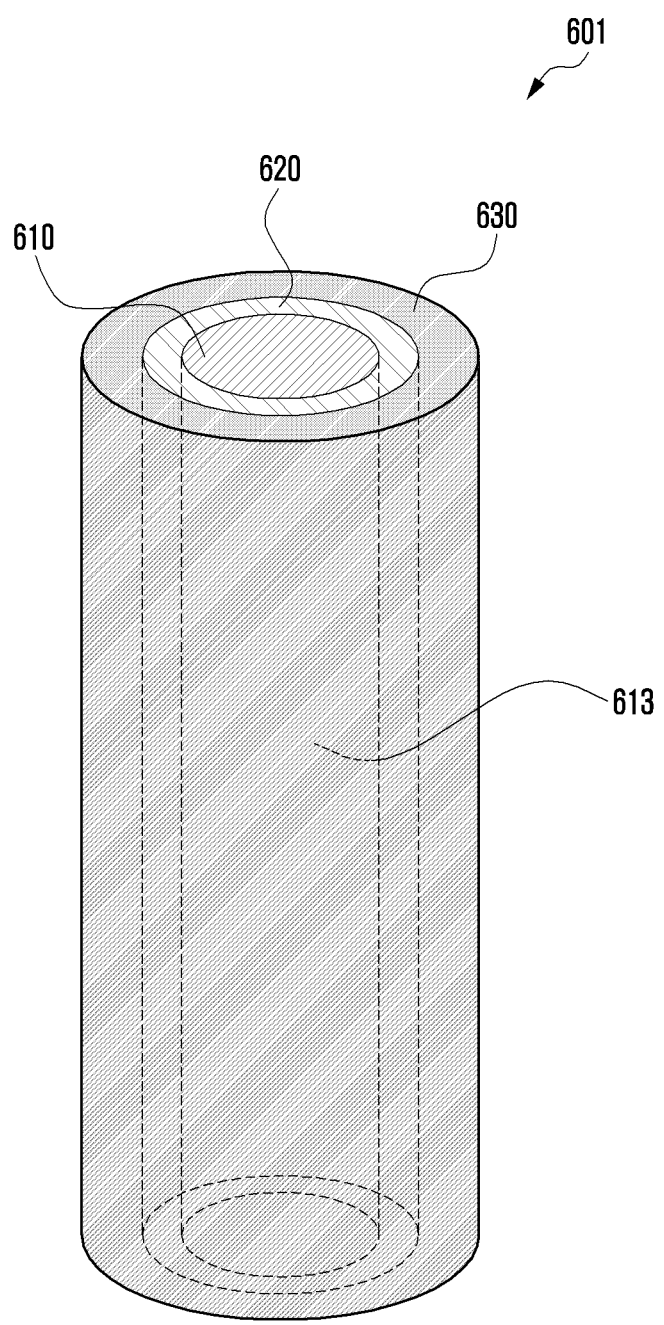
FIG. 7 illustrates a side structure of a multi-conductive member according to an embodiment.

FIG. 7 illustrates a multi-conductive member viewed from the side, according to an embodiment.

Referring to FIG. 7, the first conductive member 610 includes a conductive via 613 disposed at the center portion of the multi-conductive member 601 that passes through the inside of an interposer, and transmits electrical signals (or power).

The insulation member 620, inside the interposer, may surround the entire side surface of the first conductive member 610, e.g., the entire side of conductive via 613.

The second member 630, inside the interposer, may surround the entire side surface of the insulation member 620. The second conductive member 630 may be connected to a ground and may surround the entire side surface of the insulation member 620 surrounding the side surface of the first conductive member 610, inside the interposer, in order to improve the performance for blocking the first conductive member 610.

The first conductive member 610 may include an upper conductive pad that is exposed through a first surface of the interposer, a lower conductive pad that is exposed through a second surface of the interposer, and a conductive via that passes through the inside of the interposer and electrically connects the upper and lower conductive pads. In addition, the insulation member 620 may include a partition wall structure (e.g., a photo resist (PR) layer or peelable ink) that is exposed through a first surface and a second surface of the interposer, and a non-conductive filler that partitions the conductive via while surrounding the conductive via, inside the interposer.

Figure 8A:
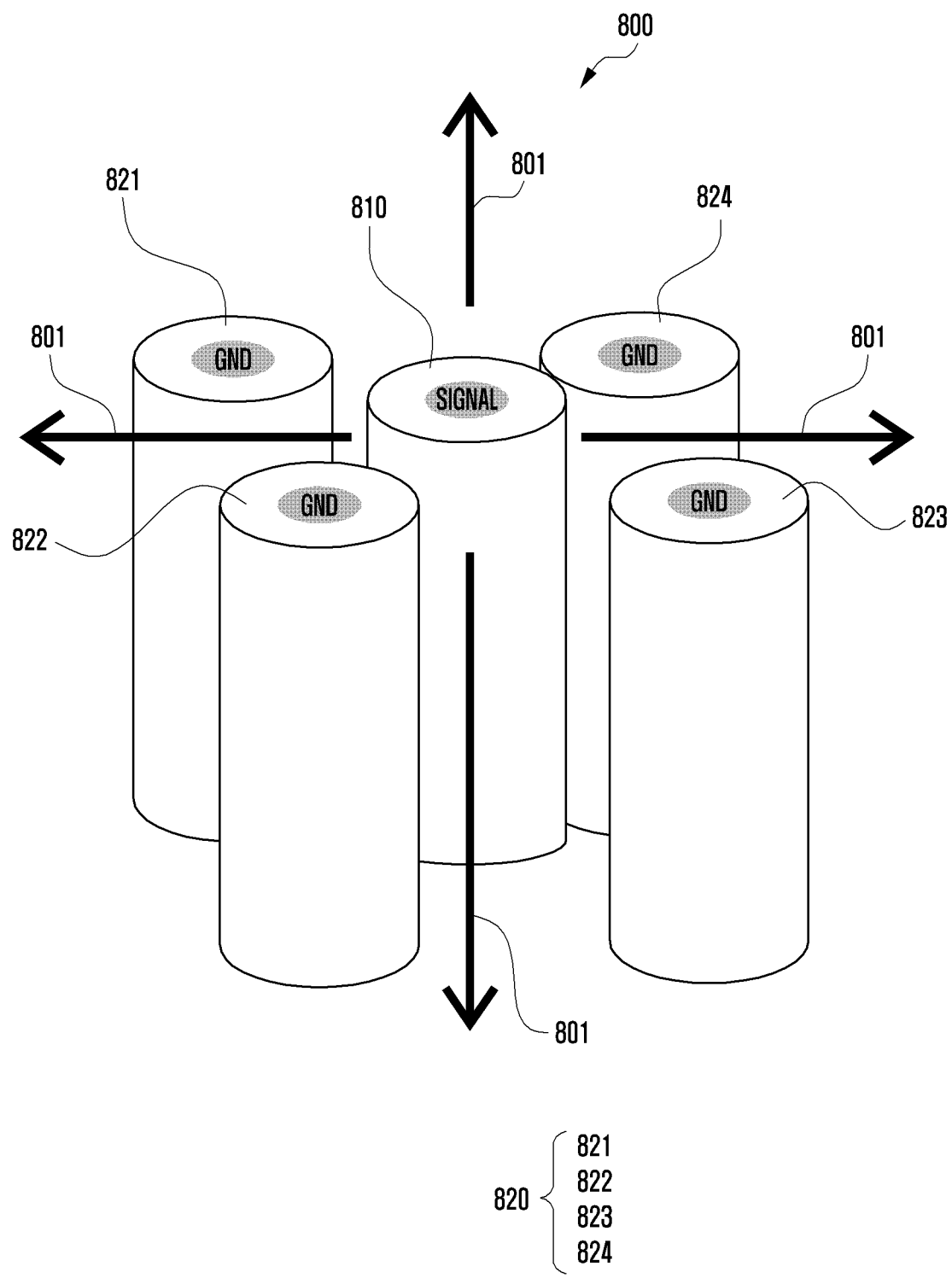
FIG. 8A illustrates a shielding effect against an external interference of an interposer according to an embodiment.
Figure 8B:
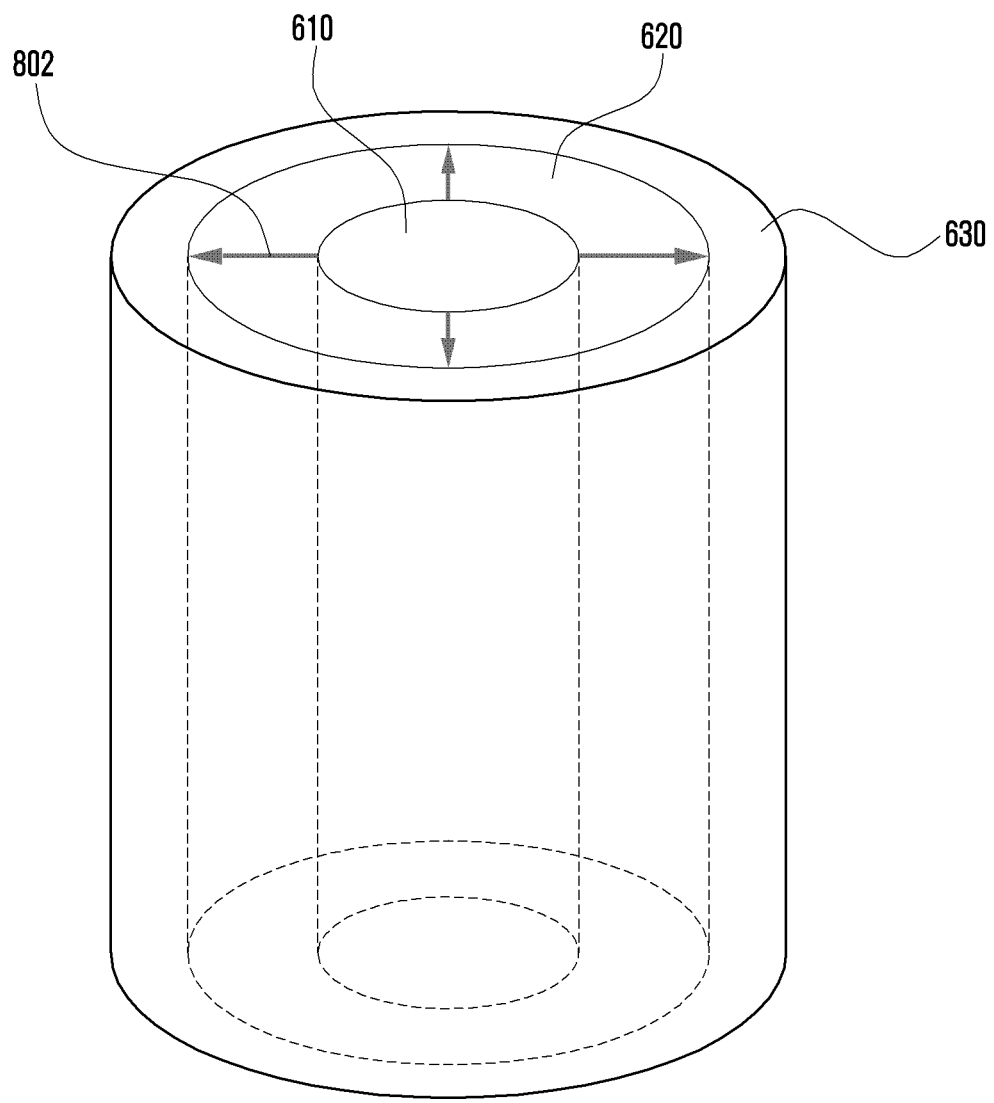
FIG. 8B illustrates a shielding effect against an external interference of an interposer according to an embodiment.

FIG. 8A illustrates a shielding effect against an external interference of an interposer according to an embodiment, and FIG. 8B illustrates a shielding effect against an external interference of an interposer according to an embodiment. More specifically, FIG. 8A illustrates a conductive member of an interposer 800 according to a comparative example, and FIG. 8B illustrates a conductive member of an interposer according to an embodiment.

Referring to FIG. 8A, an interposer 800 includes a plurality of ground members 821, 822, 823, and 824 disposed around a conductive member 810 for electrically transmitting a designated signal or a designated power. Although the interposer 800 includes four ground members 821, 822, 823, and 824 for a shielding effect in FIG. 8A, the disclosure is not limited to this number of ground members.

An open area is formed in the directions of arrows 801 of a side surface of the conductive member 810, at which the ground members 821, 822, 823, and 824 are separated from each other. Therefore, it is not possible to completely shield the conductive member 810.

However, referring to FIG. 8B, in the multi-conductive member of an interposer, a second conductive member 630 is connected to a ground and surrounds the entire side surface of the insulation member 620 surrounding the side surface of the first conductive member 610, inside the interposer, in order to improve the performance for blocking the first conductive member 610. For example, a designated signal or a designated power transmitted through the first conductive member 610, as shown by arrow 802 in FIG. 8B, is blocked by the second conductive member 630 that surrounds the entire side surface of the insulation member 620 surrounding the side surface of the first conductive member 610 inside the interposer, thereby being completely shielded.

Figure 9:
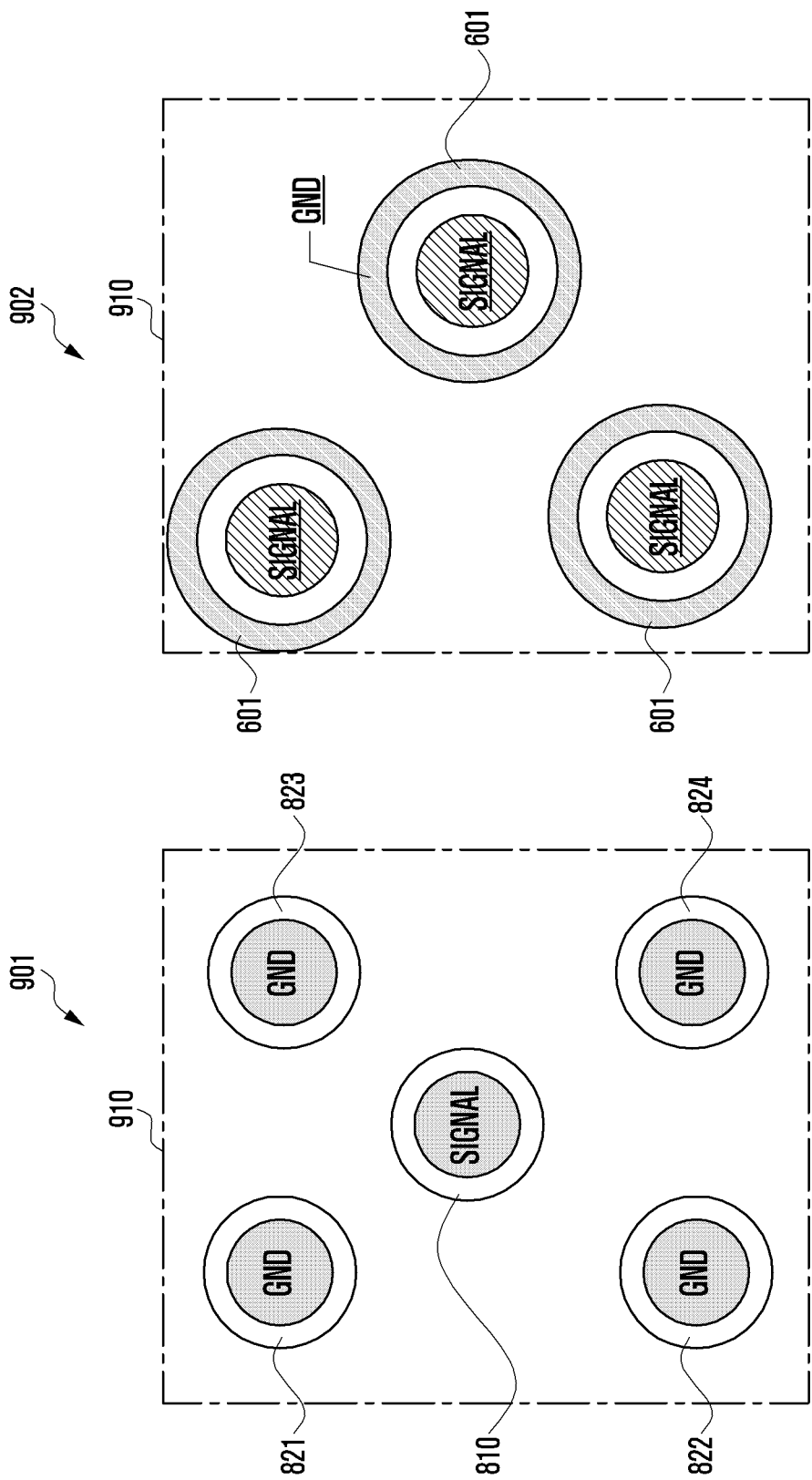
FIG. 9 illustrates a size reduction effect of an interposer according to an embodiment.

FIG. 9 illustrates a size reduction effect of an interposer according to an embodiment.

Referring to FIG. 9, the left view 901 illustrates an area 910 in which the plurality of ground members 821, 822, 823, and 824 for shielding one conductive member 810 are disposed, as illustrated in FIG. 8A.

The right view 902 illustrates the area 910 in which multiple multi-conductive members 601, as illustrated in FIG. 8B, are arranged.

When comparing the view 901 with the view 902, the plurality of ground members 821, 822, 823, and 824 for shielding the one conductive member 810 and one conductive member 810 occupy a relatively large area in comparison with the structure proposed by the disclosure. As such, in the view 902, because a ground member is formed as a cylindrical shape so as to surround the outer periphery of a first conductive member, the area occupied by one multi-conductive member 601 for transmitting one designated signal or one designated power can be reduced, such that three multi-conductive members 601 can be provided in the same area as in view 901.

As described above, an interposer according to an embodiment allows for an arrangement of more conductive members for transmitting a signal within the same area. For example, as noted from the results of experiments for comparison between an area of the disclosure and a comparative example in FIG. 9, an arrangement efficiency is about 2.2 times higher than that of the comparative example, without any significant performance degradation (or performance difference).

Conditions of the experiments were as follows.

An experiment was performed where each of the conductive member 810 and the ground member 821, 822, 823, and 824 have a diameter of 400 um, and the distances between the conductive member 810 and the ground member 821, 822, 823, and 824 are 300 um.

Further, the conductive member 610 is designed to have a diameter of 600 um.

Figure 10:
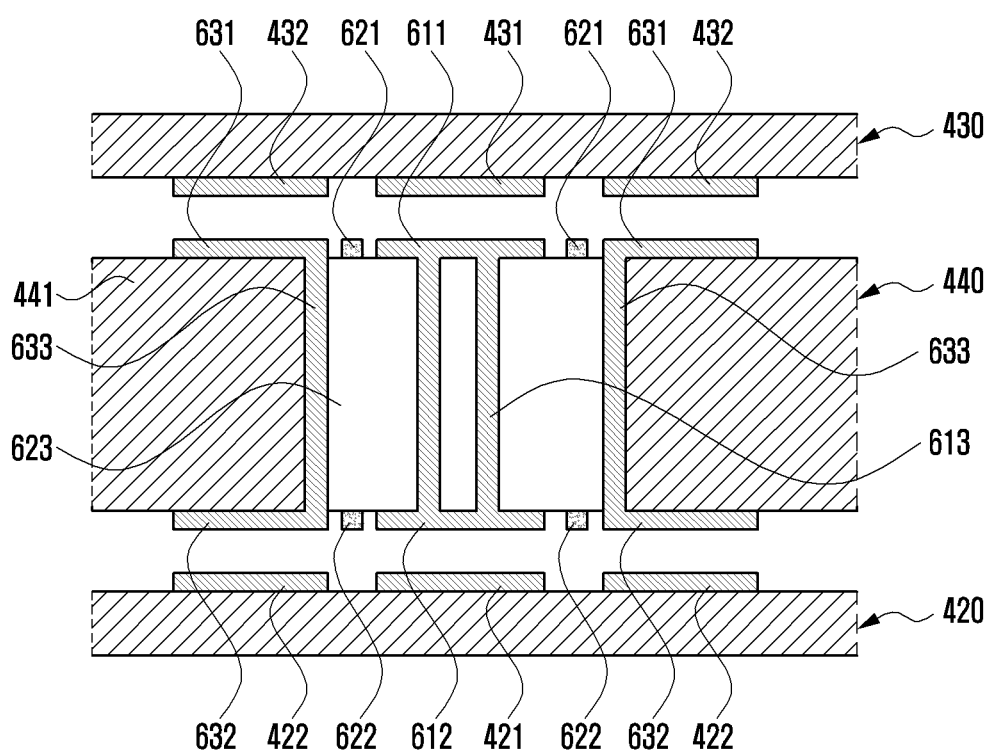
FIG. 10 illustrates a sectional view of a multi-conductive member according to an embodiment.

FIG. 10 illustrates a sectional view of a multi-conductive member according to an embodiment. For example, FIG. 10 may illustrate a sectional view of the multi-conductive member in FIG. 6 or FIG. 7.

Referring to FIG. 10, a multi-conductive member includes a first conductive member 610 for electrically transmitting a designated signal or a designated power, an insulation member 620 surrounding the first conductive member 610, on the surface of an interposer 440 and inside the interposer 440, and a second conductive member 630 surrounding the insulation member 620 and connected to a ground, on a surface of the interposer 440 and inside the interposer 440.

The first conductive member 610 may be disposed at a substantial center of a multi-conductive member 601 and may connect a first lower conductive terminal 421 formed on the surface of the first PCB 420 and a first upper conductive terminal 431 formed on the surface of the second PCB 430.

The first conductive member 610 includes an upper conductive pad 611, a lower conductive pad 612, and a conductive via 613. The upper conductive pad 611 may be exposed through a first surface of the interposer 440. The lower conductive pad 612 may be exposed through a second surface of the interposer 440. The conductive via 613 may electrically connect the upper conductive pad 611 and the lower conductive pad 612 while passing pass through an inside of the interposer 440.

The upper conductive pad 611 may be physically and electrically connected to the first upper conductive terminal 431 of the second PCB 430 facing the first surface of the interposer 440. The lower conductive pad 612 may be physically and electrically connected to the first lower conductive terminal 421 of the first PCB 420 facing the second surface of the interposer 440. Therefore, the first PCB 420 and the second PCB 430 may transmit/receive a signal or electric power through the first conductive member 610.

The insulation member 620 may include a non-conductive filler 623 or partition walls 621 and 622. The partition walls 621 and 622 may be exposed through the first surface and the second surface of the interposer 440 and may partition between the first conductive member 610 and the second conductive member 630. The partition wall may be made of a PR material or a peelable ink material. The partition walls 621 and 622 may be omitted or deleted. The non-conductive filler 623, inside the interposer 440, is formed to surround the entire side surface of the conductive via 613.

The second conductive member 630 includes a first ground pad 631, a second ground pad 632, and a ground via 633. The first ground pad 631 may be exposed through the 633 first surface of the interposer 440 and may be physically, circuitally, and electrically connected to an upper ground terminal 432 formed on the surface of the second PCB 430. The second ground pad 632 may be exposed through the second surface of the interposer 440 and may be physically, circuitally, and electrically connected to a lower ground terminal 422 formed on the surface of the first PCB 420. The ground via 633 may be formed to pass through the inside of the interposer 440 and be formed to surround the whole of the side surface of the insulation member 620, inside the interposer 440. The ground via 633 may physically, circuitally, and electrically connect the first ground pad 631 and the second ground pad 632. The ground via 633, inside the interposer 440, may be formed to surround the whole of the side surface of the non-conductive filler 623.

Figure 11:
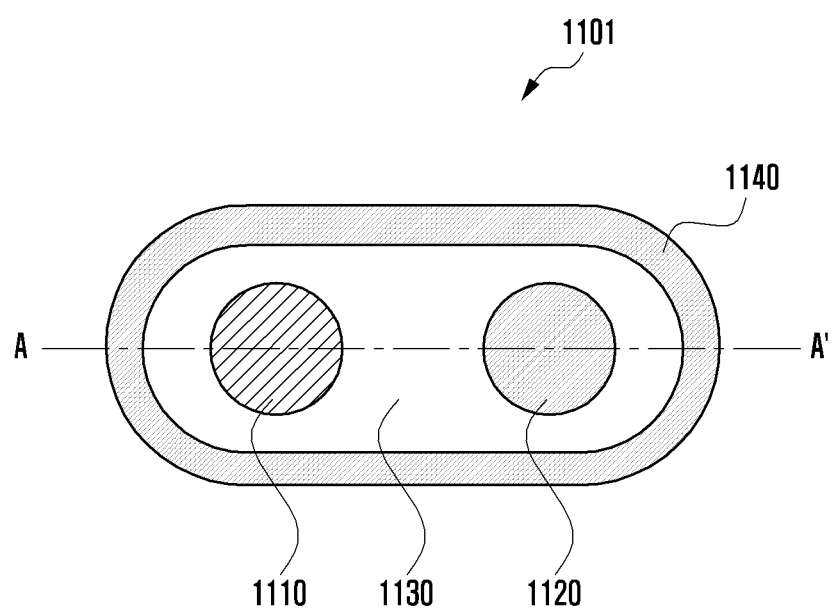
FIG. 11 illustrates plan view of a multi-conductive member including a plurality of conductive members for transmitting two different signals or electric power according to an embodiment.

FIG. 11 illustrates a multi-conductive member including a plurality of conductive members for transmitting two different signals or electric power according to an embodiment.

Referring to FIG. 11, a multi-conductive member 1101 includes a plurality of conductive members 1110 and 1120 for transmitting different signals or power. The multi-conductive member 1101 includes a first conductive member 1110, a second conductive member 1120, an insulation member 1130, and a ground member 1140. The first conductive member 1110 may be configured to transmit a first signal (or first electric power). The second conductive member 1120 may be configured to transmit a second signal (or second electric power).

According to one embodiment of the disclosure, the multi-conductive member 601 may include the two or more conductive members 1110 and 1120 and the two or more conductive members may be configured to transmit two signals different from each other or electric powers different from each other. For example, the multi-conductive member 601 may include the two conductive members 1110 and 1120 for transmitting two signals different from each other or power. According to an embodiment, the different signals or power may be two paired signals or a differential signal. According to various embodiments, the different signals or power may be two paired signals or a differential signal based on at least one of a MIPI, a universal flash storage (UFS), an HDMI, a mobile high-definition link (MHL), a USB, or audio signals.

Figure 12:
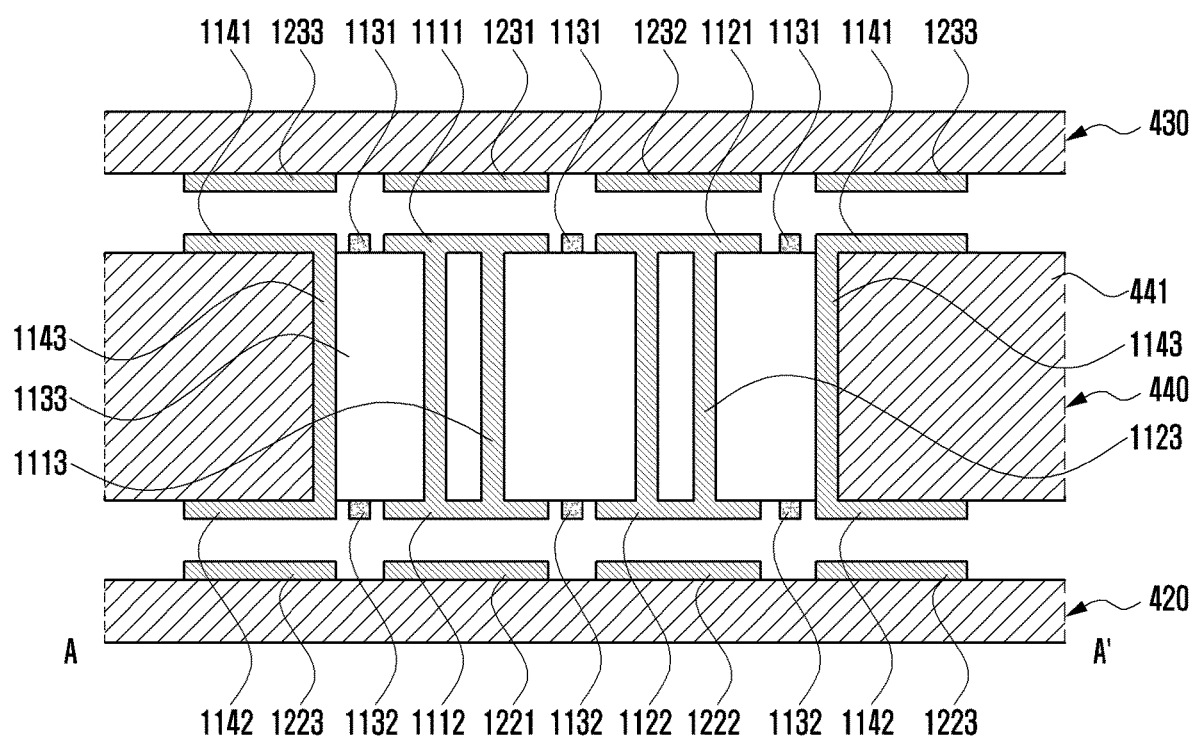
FIG. 12 different a sectional view of the multi-conductive member illustrated in FIG. 11.

FIG. 12 illustrates a sectional view of the multi-conductive member illustrated in FIG. 11. Specifically, FIG. 12 is a sectional view along line A-A' in FIG. 11.

Referring to FIG. 12, a multi-conductive member 1101 includes a first conductive member 1110, a second conductive member 1120, an insulation member 1130, and a ground member 1140.

The first conductive member 1110 may electrically transmit a designated first signal or a designated first power. The first conductive member 1110 includes a first upper conductive pad 1111, a first lower conductive pad 1112, and a first conductive via 1113.

The second conductive member 1120 may electrically transmit a designated second signal or a designated second power. The second conductive member 1120 includes a second upper conductive pad 1121, a second lower conductive pad 1122, and a second conductive via 1123.

The insulation member 1130 partitions between the first conductive member 1110 and the second conductive member 1120 and surrounds the entire side surfaces of the first conductive member 1110 and the second conductive member 1120, inside the interposer 440. The insulation member 1130 includes partition walls 1131 and 1132 and/or a non-conductive filler 1133.

The ground member 1140 surrounds the insulation member 1130 inside the interposer 440 and is connected to the ground. The ground member 1140 includes a first ground member 1141, a second ground member 1142, and a ground via 1143.

In FIG. 12, reference numeral 1221 denotes a first lower conductive terminal formed on the surface of the first PCB 420, which may be configured to be electrically and physically connected to the first conductive member 1110. Reference numeral 1222 denotes a second lower conductive terminal formed on the surface of the first PCB 420, which may be configured to be electrically and physically connected to the second conductive member 1120. Reference numeral 1223 denotes a lower ground terminal formed on the surface of the first PCB 420, which may be configured to be electrically and physically connected to the ground member 1140. Reference numeral 1231 denotes a first upper conductive terminal formed on the surface of the second PCB 430, which may be configured to be electrically and physically connected to the first conductive member 1110. Reference numeral 1232 denotes a second upper conductive terminal formed on the surface of the second PCB 430, which may be configured to be electrically and physically connected to the second conductive member 1120. Reference numeral 1233 denotes an upper ground terminal formed on the surface of the second PCB 430, which may be configured to be electrically and physically connected to the ground member 1140.

Figure 13:
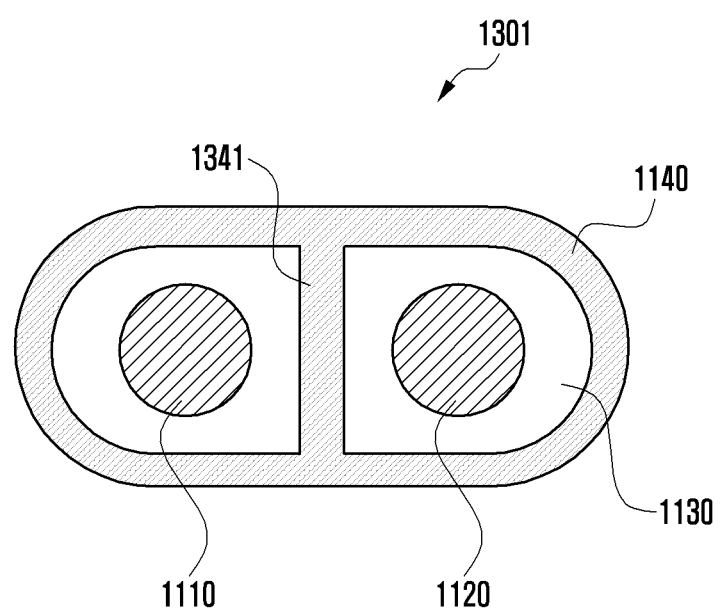
FIG. 13 different a plan view of a multi-conductive member including a plurality of conductive members for transmitting two different signals or electric power according to an embodiment.

FIG. 13 illustrates a multi-conductive member including a plurality of conductive members for transmitting two different signals or electric power according to an embodiment.

Referring to FIG. 13, a multi-conductive member 1301 includes a plurality of conductive members 1110 and 1120 for transmitting different signals or power. More specifically, the multi-conductive member 601 includes a first conductive member 1110, a second conductive member 1120, an insulation member 1130, and a ground member 1140. Differing from the multi-conductive member 1101 illustrated in FIG. 11, the ground member 1140 of the multi-conductive member 1301 illustrated in FIG. 13 includes a middle ground member 1341 formed between the first conductive member 1110 and the second conductive member 1120, and the middle ground member 1341 may be configured to block a signal interference between the first conductive member 1110 and the second conductive member 1120.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to an embodiment of the disclosure, an electronic device is provided, which includes an interposer for securing a design margin through an appropriate design change of a ground disposed around a terminal and reducing an interference in which a signal transmitted through the terminal is affected by the vicinity thereof.

While the disclosure has been shown and described with reference to certain embodiments thereof, it will be understood by those skilled in the art that various changes in form and details may be made therein without departing from the spirit and scope of the disclosure as defined by the appended claims and any equivalents thereof.

What is claimed is:

1. An electronic device comprising:
    a first printed circuit board (PCB) including a first conductive terminal;
    a second PCB including a second conductive terminal; and
    an interposer including a dielectric substrate and a multi-conductive member that passes though the dielectric substrate and electrically connects the first conductive terminal of the first PCB and the second conductive terminal of the second PCB,
    wherein the multi-conductive member comprises:
        an insulation member;
        a first conductive member that is disposed inside the insulation member;
        a second conductive member disposed inside the insulation member and separated from the first conductive member; and
        a ground member disposed between the insulation member and the dielectric substrate, and
    wherein the first conductive member and the second conductive member respectively transmit a designated signal or a designated power to the first PCB or the second PCB.

2. The electronic device of claim 1, wherein the insulation member surrounds an entire side surface of the first conductive member inside the interposer.

3. The electronic device of claim 2, wherein the ground member surrounds an entire side surface of the insulation member inside the interposer.

4. The electronic device of claim 1, wherein the first conductive member comprises:
    an upper conductive pad that is exposed through a first surface of the interposer that faces the second PCB;
    a lower conductive pad that is exposed through a second surface of the interposer that faces the first PCB; and
    a conductive via that passes through the interposer and electrically connects the upper conductive pad and the lower conductive pad.

5. The electronic device of claim 4, wherein the insulation member comprises non-conductive filler that partitions between the conductive via and the ground member inside the interposer.

6. The electronic device of claim 1, wherein a first signal is transmitted through the first conductive member and a second signal is transmitted through the second conductive member.

7. The electronic device of claim 6, wherein the first signal and the second signal comprise two paired signals or a pair of differential signals.

8. The electronic device of claim 6, wherein the ground member comprises a middle ground member formed between the first conductive member and the second conductive member.

9. The electronic device of claim 6, wherein the first conductive member has the same structure as the second conductive member.

10. The electronic device of claim 9, wherein the second conductive member comprises:
    a second upper conductive pad that is exposed through a first surface of the interposer that faces the second PCB;
    a second lower conductive pad that is exposed through a second surface of the interposer that faces the first PCB; and
    a second conductive via that passes through the interposer and electrically connects the second upper conductive pad and the second lower conductive pad.

11. An interposer, comprising:
    a dielectric substrate; and
    a multi-conductive member that passes though the dielectric substrate and electrically connects a first conductive terminal of a first printed circuit board (PCB) and a second conductive terminal of a second PCB, the multi-conductive member including:
        an insulation member;
        a first conductive member that is disposed inside the insulation member;
        a second conductive member disposed inside the insulation member and separated from the first conductive member; and
        a ground member disposed between the insulation member and the dielectric substrate, wherein the first conductive member and the second conductive member respectively transmit a designated signal or a designated power to the first PCB or the second PCB.

12. The interposer of claim 11, wherein the insulation member surrounds an entire side surface of the first conductive member inside the interposer.

13. The interposer of claim 12, wherein the ground member surrounds an entire side surface of the insulation member inside the interposer.

14. The interposer of claim 11, wherein the first conductive member comprises:

an upper conductive pad that is exposed through a first surface of the interposer that faces the second PCB;

a lower conductive pad that is exposed through a second surface of the interposer that faces the first PCB; and a conductive via that passes through the interposer and electrically connects the upper conductive pad and the lower conductive pad.

15. The interposer of claim 14, wherein the insulation member comprises non-conductive filler that partitions between the conductive via and the ground member inside the interposer.

16. The interposer of claim 11, wherein a first signal is transmitted through the first conductive member and a second signal is transmitted through the second conductive member.

17. The interposer of claim 16, wherein the first signal and the second signal comprise two paired signals or a pair of differential signals.

18. The interposer of claim 16, wherein the ground member comprises a middle ground member formed between the first conductive member and the second conductive member.

19. The interposer of claim 16, wherein the first conductive member has the same structure as the second conductive member.

20. The interposer of claim 19, wherein the second conductive member comprises:

a second upper conductive pad that is exposed through a first surface of the interposer that faces the second PCB;

a second lower conductive pad that is exposed through a second surface of the interposer that faces the first PCB; and a second conductive via that passes through the interposer and electrically connects the second upper conductive pad and the second lower conductive pad.

* * * * *